(12) United States Patent
DeSanctis (10) Patent No.: US 9,681,561 B2
(45) Date of Patent: Jun. 13, 2017

(54) ELECTRIC CIRCUIT GUISED AS A PRACTICAL CARRYALL

(71) Applicant: Jeanne DeSanctis, Hobe Sound, FL (US)

(72) Inventor: Jeanne DeSanctis, Hobe Sound, FL (US)

( * ) Notice: Subject to any disclaimer, the term of this patent is extended or adjusted under 35 U.S.C. 154(b) by 548 days.

(21) Appl. No.: 14/290,834

(22) Filed: May 29, 2014

(65) Prior Publication Data

US 2015/0351263 A1 Dec. 3, 2015
US 2017/0006717 A9 Jan. 5, 2017

Related U.S. Application Data

(63) Continuation-in-part of application No. 12/658,392, filed on Feb. 5, 2010, now abandoned.

(60) Provisional application No. 61/208,387, filed on Feb. 23, 2009.

(51) Int. Cl.
| | | |
|---|---|---|
| *A45C 13/00* | (2006.01) | |
| *H01R 25/00* | (2006.01) | |
| *H05K 5/00* | (2006.01) | |
| *H05K 5/02* | (2006.01) | |
| *H02J 4/00* | (2006.01) | |
| *H02J 7/00* | (2006.01) | |
| *H01R 27/02* | (2006.01) | |

(52) U.S. Cl.
CPC ......... *H05K 5/0047* (2013.01); *A45C 13/001* (2013.01); *H01R 25/006* (2013.01); *H02J 4/00* (2013.01); *H02J 7/0027* (2013.01); *H05K 5/023* (2013.01); *H05K 5/0243* (2013.01); *H01R 27/02* (2013.01); *Y10T 307/492* (2015.04)

(58) Field of Classification Search
CPC .... A45C 13/00; A45C 13/001; H01R 25/006; H02J 4/00; H02J 7/0027; H05K 5/0047; H05K 5/0247
USPC ........................................................... 307/42
See application file for complete search history.

(56) References Cited

U.S. PATENT DOCUMENTS

| | | | |
|---|---|---|---|
| 2,714,713 A | 8/1955 | Parajon | |
| 5,772,036 A | 6/1998 | Muncy et al. | |
| 5,982,138 A | 11/1999 | Krieger | |
| 6,586,849 B2 | 7/2003 | Tarr | |
| 6,614,206 B1 | 9/2003 | Wong et al. | |
| 7,855,528 B2 * | 12/2010 | Lee ...................... | H02J 7/0027 320/107 |
| 7,891,495 B2 | 2/2011 | Nobles et al. | |
| 2004/0085694 A1 * | 5/2004 | Germagian ........... | A45C 13/02 361/90 |
| 2005/0156564 A1 | 7/2005 | Krieger | |
| 2005/0164545 A1 * | 7/2005 | Rosenthal ............ | H01R 25/003 439/501 |
| 2006/0119104 A1 * | 6/2006 | Wall ...................... | H02J 7/32 290/2 |
| 2006/0280519 A1 | 12/2006 | Mori et al. | |

(Continued)

*Primary Examiner* — Levi Gannon
(74) *Attorney, Agent, or Firm* — Benjamin Davis (57) ABSTRACT

The word "carryall" generally refers to a bag having a storage compartment with a base, where the base is a housing for an electric circuit that distributes power to various AC receptacles and USB ports. The storage compartment may be constructed, without limitation, as soft sided luggage, a duffle bag, a carpet bag, a weekender, a tote, a small polyester active bag, or the like and may be made from canvas, polyester fabric, natural leather, or similar materials.

8 Claims, 5 Drawing Sheets

(56) References Cited

U.S. PATENT DOCUMENTS

2007/0072476 A1\* 3/2007 Milan .................. H01R 25/003
439/373
2008/0044717 A1\* 2/2008 Chou ................ H01M 8/04082
429/421
2008/0258677 A1 10/2008 Lee \* cited by examiner

ELECTRIC CIRCUIT GUISED AS A PRACTICAL CARRYALL

CROSS REFERENCE TO RELATED APPLICATIONS

This application is a continuation in part of and claims priority to U.S. patent application Ser. No. 12/658,392 filed on Feb. 5, 2010, which is abandoned. U.S. patent application Ser. No. 12/658,392 claims priority to U.S. Provisional Patent Application No. 61/208,387 filed on Feb. 23, 2009, which has expired.

FIELD OF THE INVENTION

The present invention generally relates to an electric device. More specifically, the invention is an electric circuit that distributes power guised as a practical carryall. The electric circuit is concealed in the bottom of the carryall and distributes both AC and DC power to multiple AC receptacles and USB ports, while minimizing the risks of having current near light fabrics.

BACKGROUND OF THE INVENTION

In today's world, people love electronics. One person could have a smart-phone, an organizer, a computer tablet, a digital camera, various lap tops, portable music players, or portable video games. These electronics are an important part of people's everyday lives and have moved past their intended purpose to become fashion accessories in their own right.

A drawback to these devices is that their internal batteries need constant recharging by with an AC or DC adaptor and a power source. People have chargers for all of their devices, and when traveling, it is hard to organize all of these chargers and find enough accessible wall sockets to distribute power to each device. Having an electric circuit guised as a practical carryall would distribute the current needed to recharge or power these devices and give a compartment to carry them when traveling.

Although the present invention provides for an electric circuit guised as a carryall, there are inherent risks with directing current close to fabric materials. At any moment the circuit is at risk of overloading, being compromised by a moist environment, or having limited air circulation for venting heat. Because one embodiment of the invention includes a small carryall made from light weight materials used in the fashion and apparel industry, it is important that these risks are fully appreciated to provide a safe electric device.

U.S. Pat. No. 2,714,713 to Parajon discloses an electric outlet.

U.S. Pat. No. 6,586,849 to Tarr discloses a power strip that uses a computer's USB current as a trigger to allow current to flow through an electric circuit.

U.S. Pat. No. 6,614,206 to Wong et al. concerns a cube shaped apparatus for distributing power having only USB jacks. The electronic circuit recharges more than one device and provides data communication between electronics. The apparatus has two plugs and may receive power from a wall socket or from another electronic device by a USB plug.

U.S. Pat. App. Pub. No. 2006/0280519 filed by Mori et al. concerns a charging station in the form of a tray that has a surge protector underneath. The tray holds the electronics during recharging when current flows through the attached surge protector. The surge protector circuit is separate from the tray and can be disconnected from each other during the recharging of electronics. Mori discloses the use of USB hub that can be connected to the surge protector, but the USB hub is not a part of the surge protector circuit.

U.S. Pat. No. 7,891,495 to Nobles et al. discloses a bag for housing batteries.

U.S. Pat. No. 5,772,036 to Muncy et al. discloses an electric accessories bag for storing appliances and toiletries. The bag is made like a suitcase and has two sections that are hinged together. The first section has a retractable cord that extends interiorly through the bag. The power strip is disposed within the first section of the bag. The first section also has pouches to receive toiletries.

U.S. Pat. No. 5,982,138 to Krieger discloses a portable power source for recharging car batteries. The power source includes an industrial DC battery housed in the bottom of a workman's bag. The workman's bag is made from a heavy duty impact-resistant polyethylene case. The DC battery is connected to a pair of heavy jumper cables. In another embodiment, the bag is made of a flexible yet heavy duty material and contains a 12-volt, 3 amp-hour (up to 7 amp) battery and a separate inverter, a 50 Watt (up to 100 Watt) inverter, to convert current from DC to AC. The bag weighs up to 5 lbs. Krieger discloses the use of one AC socket.

U.S. Pat. App. Pub. No. 2005/0156564 filed by Krieger discloses a tool box power center. The tool box supplies power to power tools, e.g. electric saws, drills, screwdrivers, and etc. The tool box has a cavity for storing these tools. Although not disclosed by Krieger, the tool box should be made from industrial materials. A DC battery is disposed in the floor of the tool box and supplies power for recharging car batteries, powering tools, or electronics. The tool box also requires an inverter to convert DC to AC, where the tool box provides at least one AC socket. The tool box is also supplied with jumper cables. The tool box may also accommodate an air compressor and a battery charger. A plug is needed to connect the tool box to an AC outlet to recharge the battery.

U.S. Pat. App. Pub. No. 2008/0258677 filed by Lee discloses a power supply having batteries and multiple USB ports.

All references either disclose heavy bags having an internal power source for supplying power to devices for industrial uses or devices that use uncovered powerstrips for distributing power to a load. None describe an electric circuit guised as a practical carryall that distributes both AC and DC power simultaneously, where the device minimizes the risks of having current distributed near fabrics. Therefore, there is a need for the present invention.

SUMMARY OF THE INVENTION

Embodiments of the present invention address these problems via a carryall for distributing power to electronics having a storage compartment secured to a base that is a housing for an electric circuit. The circuit simultaneously distributes both an alternating current to a number of AC receptacles and a direct current to a number of USB ports when the circuit is plugged into an external power source. The storage compartment is secured to the housing by a connecting plate having feet that accept screws that pass through a bottom panel of the storage compartment and into threaded holes located on a top part of the housing, and the electric circuit is concealed in the housing that serves as the base for the carryall.

It is an aspect of the present invention, wherein the housing is formed by screwing together a top and a bottom part, both molded from a fire retardant high flow polymer, which forms a parallelepipedal shape housing with round edges and apertures for six AC receptacles and two USB ports.

It is an aspect of the present invention, wherein the electric circuit comprises a three prong power cord, a surge protector, corrosion resistant wiring, six AC receptacles, and a sub-circuit further comprising a printed wiring board having a step-down transformer, a diode bridge for AC to DC conversion, a smoothing capacitor, fuses, optical isolators, integrated circuit chip for voltage regulation, or any combinations thereof.

It is an aspect of the invention, wherein the electric circuit is either switched or un-switched, wherein a switched circuit is of a switched supplementary protector.

It is an aspect of the invention, wherein the storage compartment is one of the following: a soft sided luggage, a duffle bag, a carpet bag, a weekender, a tote, or a small active bag, and is made from any of the following materials including canvas, polyester fabric, natural leather, or any combinations thereof.

It is an aspect of the present invention, wherein the storage compartment is lined with fire resistant foam or made from a fire resistant material.

It is an aspect of the invention, wherein a three prong power cord is permanently attached to the circuit and, when not in use, may be stored in a compartment on the bottom surface of the housing.

It is an aspect of the invention, wherein a practical carryall for distributing power to electronics has an electrical circuit concealed in a parallelepipedal shaped housing that serves as a base for the carryall. The carryall has a storage compartment that is a small active bag made from a polyester fabric that has been lined or treated to be fire resistant that measures from 12 in. long by 6 in. wide with a height of 6 in. and is capable of carrying weights up to 5 lbs. A top and a bottom part screws together and form the parallelepipedal shaped housing, where each of the top and bottom parts measure from 8.75 in. long by 4.75 in. wide by 1.54 in. high, with a minimum thickness of 0.087 in., and wherein, the storage compartment is connected to the housing by a connecting plate having feet that pass through a bottom panel of the carryall's storage compartment; and wherein the circuit simultaneously distributes both alternating current to six AC receptacles and direct current to two USB ports when the circuit is plugged into an external power source.

It is an aspect of the invention, wherein the carryall is soft sided luggage, a duffle bag, a carpet bag, a weekender, a tote, or a small active bag, and may be made from canvas, polyester fabric, or natural leather.

It is an aspect of the present invention, wherein the fabric is lined with fire resistant foam or treated with a fire resistant material.

It is an aspect of the present invention, wherein the three prong power cord is permanently attached to the circuit and, when not in use, may be stored in a compartment on the bottom surface of the housing.

It is an aspect of the invention, wherein an electric circuit guised as a practical carryall for distributing power to electronics has a circuit concealed in a parallelepipedal shaped housing that serves as a base for a carryall, wherein the carryall is in the form of a small active bag made from a polyester fabric that has been lined or treated to be fire resistant and has a storage compartment that measures from about 12 in. long by about 6 in. wide by a height of about 6 in. and may carry weights from about 2 lbs to about 5 lbs, wherein top and bottom parts screw together and form the parallelepipedal shaped housing where each housing part measures from about 8.75 in. long by about 4.75 in. wide by about 1.54 in. high, with a minimum thickness of about 0.087 in., wherein the carryall is connected to the housing by a connecting plate having feet that pass through the bottom panel of the carryall's storage compartment, and wherein the circuit simultaneously distributes both alternating current to six AC receptacles and direct current to two USB ports when the circuit is plugged into an external power source.

BRIEF DESCRIPTION OF THE DRAWINGS

The drawings are briefly described as follows.

DETAILED DESCRIPTION OF THE INVENTION

From this point forward, the following words will describe an electric circuit guised as a practical carryall that distributes electricity. However, these words are not a limitation on the scope of the present invention but are written to detail certain embodiments thereof.

DEFINITIONS

The word "carryall" generally refers to soft sided luggage, a duffle bag, a carpet bag, a weekender, a tote, a small polyester active bag, or the like. The carryall may be made from canvas, polyester fabric, natural leather, or similar materials.

The words "electric circuit" generally refers to an AC circuit capable of distributing power of at least 120 V to about 125 V and having a sub circuit to convert 120 V AC to 5V DC and distributes a smaller amount of power.

The word "parallelepipedal" generally refers to the housing's rhomboid type shape formed when the housing's top and bottom parts are screwed together, where the edges are slightly curved.

Figure 1:
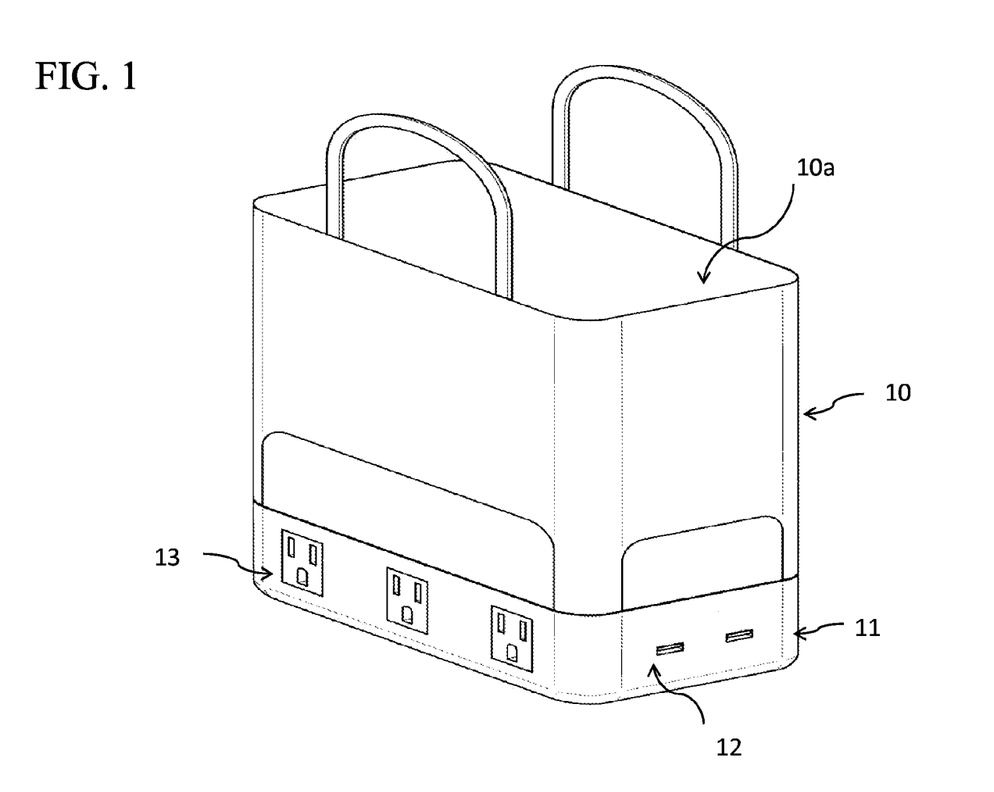
FIG. 1—shows the general embodiment of the present invention being an electric circuit concealed in a resilient housing that serves as a base for a practical carryall. The housing has a number of AC receptacles and USB ports that electrically connect to the circuit.

From FIG. 1, the present invention 1 concerns an electric circuit that distributes electricity in the guise of a practical carryall 10, where the circuit is concealed in a sturdy housing 11 that serves as the base for the carryall 10. The circuit is equipped with an on/off switch, a surge protector, and simultaneously distributes both alternating and direct current when connected to an external wall outlet. The circuit directs alternating and direct current to AC receptacles 13 and USB ports 12 located about the sides and front of the housing 11 respectively. The practical carryall 10 provides a storage compartment to carry unplugged electronics and their chargers. To balance the harm of having electricity so close to fabrics used to make fashion apparels, the housing 11 is made from an insulated material and the carryall 10 is reinforced, treated, or made from a fire resistant material. Not shown in FIG. 1 is the circuit's three prong electrical cord that plugs into an electrical outlet.

The Electric Circuit

Figure 2:
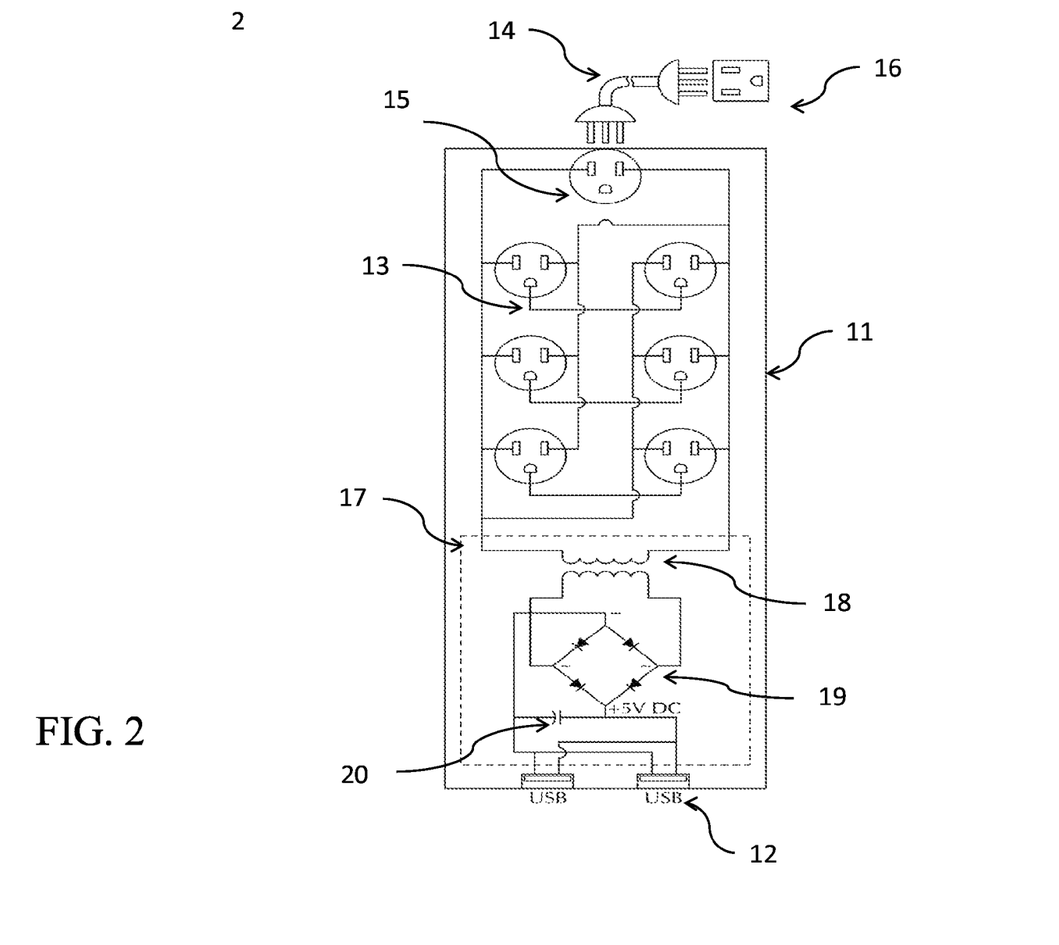
FIG. 2—shows a schematic of the electric circuit, where the circuit distributes an alternating current to multiple AC receptacles and to a sub-circuit, which converts AC to DC to distribute power to USB ports.

FIG. 2 shows a simple schematic for the electric circuit 2 that functions like a power strip that is capable of distributing a current of about 15 A, at about 120 V to about 125 V, at a cycle of about 60 Hz, having a power limit of up to 1875 Watts, and with a maximum temperature rise of about 22° C. The circuit 2 includes one single length flexible power cord 14 that is electrically connected to the circuit 2 and is stored within a compartment in the bottom surface of the housing 11 where the receptacles 13 are mounted.

The power cord 14 is of the 3-conductor grounding type and is permanently and electrically connected to the circuit 2. Although the power cord 14 is shown as being detachable, it is an embodiment of the invention where the power cord 14 is permanently attached to the circuit 2. The power cord 14 directs electricity through the circuit 2 when connected to an external outlet 16 and may be up to about 1½ to 2 feet in length. The cord 14 may be stored within a compartment that recesses into the bottom surface of the parallelepipedal shaped housing 11. Electricity flows through the power cord 14, past the surge protector 15, and to the remaining elements of the circuit 2.

A surge protector 15 lies between the power cord 14 and the remaining elements of the circuit 2 to allay voltage spikes by blocking or shorting to ground any unwanted voltages. The circuit's 2 surge protector 15 may be an electromagnetic interference filter or a switched supplementary protector.

It is within the scope of the present invention where surge protection is provided by a switched supplementary protector, a non limiting example being a Jomex Electric Corp. QVNU2/8 Type M1 being rated at about 125 Vac max. at about 15 A max. The switched supplementary protector has three terminals, where the line conductor is secured to the input of the circuit 2, a black 14 AWG wire jumpers the switch's output terminal to the AC receptacles, the neutral conductor is connected to a terminal, then a 14 AWG white jumper wire is provided from the terminal to the receptacles, the neutral path does not pass through the switch. The neutral wire also provides for switch illumination.

The circuit's 2 wiring is electrically connected to a series of AC receptacles 13 that can bear loads when in direct contact with electronics or anything requiring electricity to work. It is an embodiment of the invention wherein the electric circuit 2 includes at least six AC grounded straight blade receptacles 13, where the AC receptacles 13 may be the NEMA 5-15 type but can be made to comply with other NEMA AC receptacle standards. Three AC receptacles 13 are in series and are then connected to up to another three AC receptacles 13 and have copper alloy bars being line/neutral contacts with a length up to about 4.6", where two bars are provided. Each bar has five contacts evenly spaced by about 1.01" center on center with only every other one in use, where 14 AWG conductors are mechanically secured and soldered to each end of the contacts.

The electric circuit's 2 ground contact is a copper alloy bar being about 4.85" in length. The ground contact has five evenly spaced openings of dimensions of about 0.27" by about 0.103". Only every other ground contact opening is used and 14 AWG conductors are mechanically secured and soldered to each end of the contacts. Copper alloy for both the AC receptacles and ground contact is treated for corrosion resistance.

Converting AC into DC Via a Sub-Circuit

When completing the AC circuit 2, electricity flows to a sub circuit having a printed circuit board 17 that supplies electricity to at least two USB ports 12. At the printed circuit board 17, voltage is decreased and converted to direct current. The USB ports 12 should distribute power at about 5 V DC at 1 A to about 3.1 A. It is within the scope of the invention wherein the USB ports maybe any of the types USB 1.0 up to USB 3.0.

From FIG. 2, elements of the sub-circuit include without limitation: a printed wiring board 17, being, without limitations, about 1.5 mm thick and being overall 32 mm by 78 mm, an integrated circuit (not shown) being, without limitation, an eight pin package type AP8012 (not shown), a diode bridge 19 being, without limitation, type DB 107 rated 1 A, 700 Vrms. The sub-circuit also includes a transformer 18 being, without limitation, a two flanged bobbin associated with a ferro-magnetic core and copper windings capable of conduction, where the bobbin is wrapped by two layers of polyester tape, and where the core (not shown) may be, without limitation, 16.5 mm by 14.8 mm by 4.8 mm.

The sub circuit also includes an electrolytic smoothing capacitor 20 with integral pressure relief, being, without limitation, about a 400 V rating at 6.8 uF. The printed wiring board 17 also contains fuses (not shown) being, without limitation, type 31F and rated 1 A and 250 Vac., and optical isolators (not shown), being, without limitation, type 817 with a rated isolation of 5000V. Most, if not all, elements are secured by solder to the printed wiring board 17.

The Housing

Figure 3:
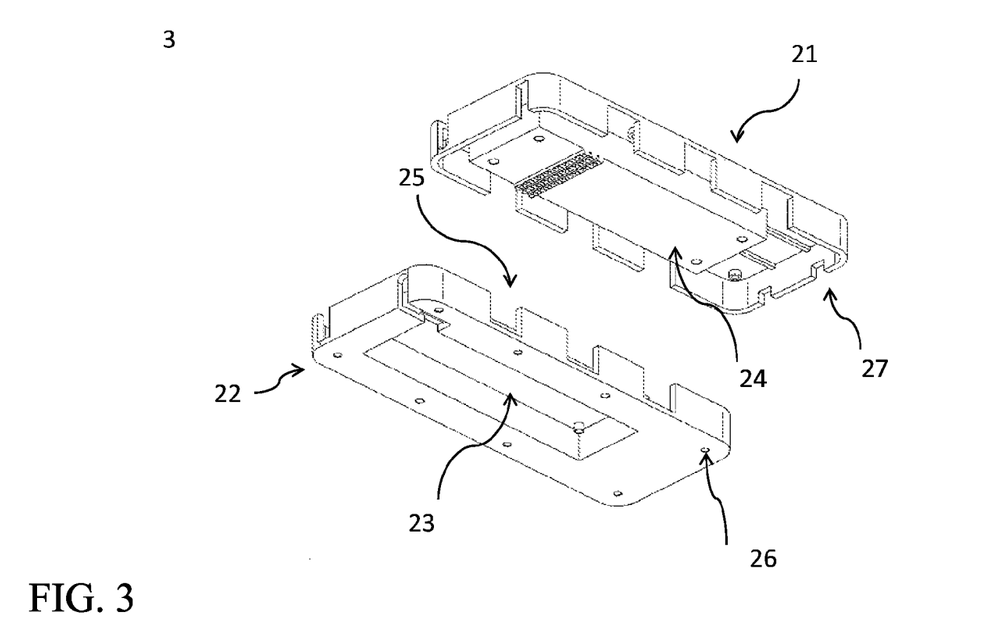
FIG. 3—shows top and bottom parts that fit together to form a parallelepipedal shaped housing that encases the electric circuit. The housing has side openings that accommodate the circuit's AC receptacles and front openings to accommodate the circuit's USB ports. The bottom surface of the housing has a hinged door (not shown) that covers a recessed area that stores the permanently attached cord (not shown).

FIG. 3 shows the housing assembly. The housing 3, which conceals the electric circuit 24, serves as a base for the practical carryall and is formed from a two piece design having a top 21 and a bottom 22 part. The top 21 and bottom 22 parts are molded from a fire retardant high flow polymer typically used to make coffee machines, DVD players, TV shells and the like, a non limiting example being PA-765 from Chi Mei Corp. The top part 21 has eight integral molded standoffs 26 used to secure the top part 21 to the bottom part 22. Also, the top part 21 has four ¼" holes, which provide access for four screws from the bottom part 22 to secure the carryall to the housing via a connecting plate.

When assembled, the housing 3 has a parallelepipedal shape with curved corners. A cord compartment 23 is positioned on the exposed surface of the bottom part 22 and extends into the same. The cord compartment 23 is of a size to neatly store the flexible power cord (not shown). A door (not shown) is hingedly coupled to the outer surface of the bottom part 22 to open and close the cord compartment 23. The sides of the housing 3 have apertures for the installation of AC six receptacles 25, and two USB ports 27, and a supplementary over current protector (not shown). The housing 3 also has a "U" shaped opening into the power cord storage area to allow power to exit the enclosure during use. Eight screw holes 26 are shown on the bottom part 22 and accept screws that enter from the top part 21, which secure the top 21 and bottom 22 parts forming the housing 3.

The Practical Carryall

Returning to FIG. 1, the practical carryall 10 provides the invention with a storage compartment 10a to carry electronics. The storage compartment 10a is formed by the carryall's 10 right, left, front, rear, and bottom panels that are sewn together at seams. The carryall 10 is secured to the housing 11 with a connecting plate (see FIG. 4) made from a fire retardant high flow polymer having four feet capable of holding ¼" screws that pass through the carryall's bottom panel and screws into the housing's top part. The interior of the storage compartment 10a has sewn into its seams a polyester flap lined with a fire resistant material that sets flush to the top of the connecting plate to absorb heat and protect any items that may be in the storage compartment 10a when the circuit is being used.

The carryall 10 is provided with handles and is in the form of a canvas type tote. However, the carryall 10 may be the soft sided luggage type, a duffle bag, a carpet bag, a weekender and the like. The carryall 10 may be made from canvas, polyester fabric, natural leather and the like.

Figure 4:
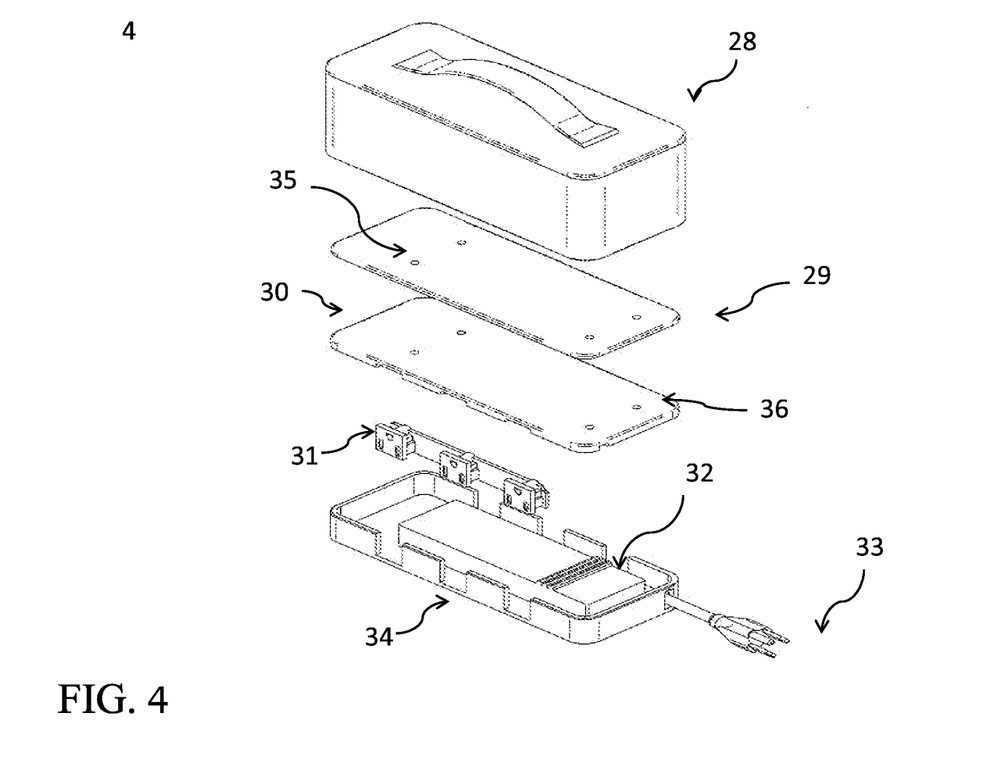
FIG. 4—shows an exploded view of the invention where the carryall is an insulated polyester bag and where the housing concealing the circuit is the base.

FIG. 4 shows an exploded view of another embodiment for the present invention. This view shows the carryall 28, a connecting plate 29, the housing's top part 30, three AC receptacles in series 31, the housing's bottom part 34, and, finally, the encased electric circuit 32 and a permanently attached three pronged cord 33.

The USB ports are not shown but are still a part of the circuit 32 with port connections on the front direction of the housing. Also note that, in FIG. 4 the electric circuit 32 is associated with housing's bottom part 34. However, in FIG. 3 the circuit is associated with the housing's top part 21. It is a preferred embodiment of the invention where the circuit may be associated with either the housing's top or bottom part.

The carryall 28 is secured to the housing's top part 30 with a connecting plate 29 made from a fire retardant high flow polymer having four feet 35 capable of holding screws that pass through the carryall's bottom panel (not shown) and screws into the top surface 36 of the housing's top part 30. The interior of the storage compartment (not shown) has sewn into its seams a polyester flap lined with a fire resistant material that sets flush to the top of the connecting plate 29 to absorb heat and protect any items that may be in the storage compartment when the circuit is being used.

Figure 5:
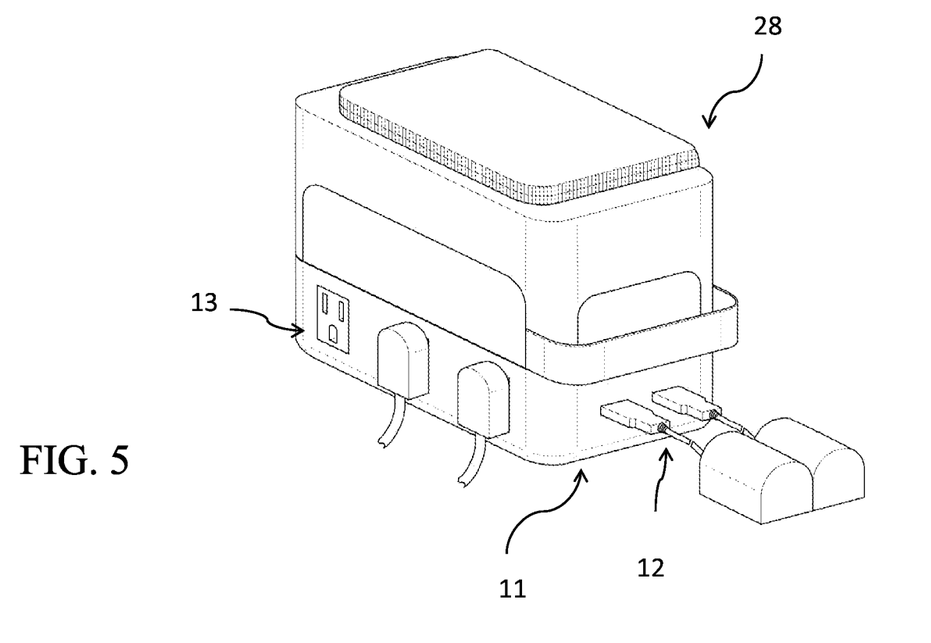
FIG. 5—shows a smaller carryall concealing an electric circuit distributing electricity to two AC plugs and two USB jacks. The power cord being plugged into an outlet is not shown.

FIG. 5 shows the invention in use, where two of the six AC receptacles 13 are being used and both USB ports 12 are also in use. The carryall 28 is in the form of a small active bag made from a polyester fabric that has been lined with fire resistant foam or treated to be fire resistant. The storage compartment and housing are water tight. The bottom and top parts are screwed together and form the parallelepipedal shaped housing 11, where each housing part measures, without limitation, from about 8.75 in. long by about 4.75 in. wide by about 1.54 in. high, with a minimum thickness of about 0.087 in. The storage compartment for FIG. 5 measures, without limitation, from about 12 in. long by about 6 in. wide by a height of about 6 in. and may carry weights from about 2 lbs to about 5 lbs.

The foregoing words describe various embodiments of an electric circuit guised as a practical carryall for distributing current to electronic devices, where the carryall has a compartment for storing these devices and their adapters when traveling. However, these words are not a limitation on the scope of the present invention, but are written to detail certain embodiments thereof. It should be understood that changes may be made by one of ordinary skill in the art to the invention without departing from the scope of the invention. Thus, the scope of the present invention may be defined solely by the following claims.

I claim:

1. A carryall for distributing power to electronics comprising:
   a. a storage compartment secured to a base that is a housing for an electric circuit, wherein the circuit simultaneously distributes both an alternating current to a number of AC receptacles and a direct current to a number of USB ports when the circuit is plugged into an external power source;
   b. wherein the storage compartment is secured to the housing by a connecting plate having feet that accept screws that pass through a bottom panel of the storage compartment and into threaded holes located on a top part of the housing; and
   c. wherein the electric circuit is concealed in the housing that serves as the base for the carryall.

2. The carryall of claim 1, wherein the housing is formed by screwing together a top and a bottom part, both molded from a fire retardant high flow polymer, which forms a parallelepipedal shape housing with round edges and apertures for six AC receptacles and two USB ports.

3. The carryall of claim 1, wherein the electric circuit comprises a three prong power cord, a surge protector, corrosion resistant wiring, six AC receptacles, and a sub-circuit further comprising a printed wiring board having a step-down transformer, a diode bridge for AC to DC conversion, a smoothing capacitor, fuses, optical isolators, integrated circuit chip for voltage regulation, or any combinations thereof.

4. The carryall of claim 3, wherein the electric circuit is either switched or un-switched, wherein a switched circuit is of a switched supplementary protector.

5. The carryall of claim 1, wherein the storage compartment is one of the following: a soft sided luggage, a duffle bag, a carpet bag, a weekender, a tote, or a small active bag, and is made from any of the following materials including canvas, polyester fabric, natural leather, or any combinations thereof.

6. The carryall of claim 1, wherein the storage compartment is lined with fire resistant foam or made from a fire resistant material.

7. The carryall of claim 1, wherein a three prong power cord is permanently attached to the circuit and, when not in use, may be stored in a compartment on the bottom surface of the housing.

8. A practical carryall for distributing power to electronics comprising:
   a. An electrical circuit concealed in a parallelepipedal shaped housing that serves as a base for the carryall;
   b. wherein the carryall has a storage compartment that is a small active bag made from a polyester fabric that has been lined or treated to be fire resistant that measures from 12 in. long by 6 in. wide with a height of 6 in. and is capable of carrying weights up to 5 lbs;
   c. wherein a top and a bottom part screws together and form the parallelepipedal shaped housing, where each of the top and bottom parts measure from 8.75 in. long by 4.75 in. wide by 1.54 in. high, with a minimum thickness of 0.087 in.;
   d. wherein, the storage compartment is connected to the housing by a connecting plate having feet that pass through a bottom panel of the carryall's storage compartment; and
   e. wherein the circuit simultaneously distributes both alternating current to six AC receptacles and direct current to two USB ports when the circuit is plugged into an external power source.

* * * * *

UNITED STATES PATENT AND TRADEMARK OFFICE
CERTIFICATE OF CORRECTION

PATENT NO. : 9,681,561 B2
APPLICATION NO. : 14/290834
DATED : June 13, 2017
INVENTOR(S) : Jeanne DeSanctis Page 1 of 1

It is certified that error appears in the above-identified patent and that said Letters Patent is hereby corrected as shown below:

On the Title Page

(57) Abstract should read:

Abstract
The present invention concerns an electric circuit to distribute electricity in the guise of a practical carryall, where the circuit is in a sturdy housing that serves as the base for the carryall. The base is made from an insulated material and the carryall is reinforced, treated, or made from a fire resistant fabric. The circuit is equipped with an on/off switch and can simultaneously distribute alternating and direct current when plugged into an external wall outlet. The circuit distributes alternating and direct current to AC receptacles and USB ports located about the base.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*